United States Patent
Ory et al.

(10) Patent No.: US 11,158,556 B2
(45) Date of Patent: Oct. 26, 2021

(54) ELECTRONIC CHIP PACKAGE HAVING A SUPPORT AND A CONDUCTIVE LAYER ON THE SUPPORT

(71) Applicant: STMICROELECTRONICS (TOURS) SAS, Tours (FR)

(72) Inventors: Olivier Ory, Tours (FR); Romain Jaillet, Tours (FR)

(73) Assignee: STMICROELECTRONICS (TOURS) SAS, Tours (FR)

( * ) Notice: Subject to any disclaimer, the term of this patent is extended or adjusted under 35 U.S.C. 154(b) by 0 days.

(21) Appl. No.: 16/552,464

(22) Filed: Aug. 27, 2019

(65) Prior Publication Data

US 2020/0075445 A1 Mar. 5, 2020

(30) Foreign Application Priority Data

Sep. 3, 2018 (FR) ...................... 1857899

(51) Int. Cl.
*H01L 23/31* (2006.01)
*H01L 21/78* (2006.01)
*H01L 21/56* (2006.01)
*H01L 29/861* (2006.01)

(52) U.S. Cl.
CPC ........ *H01L 23/3114* (2013.01); *H01L 21/561* (2013.01); *H01L 21/78* (2013.01); *H01L 29/861* (2013.01)

(58) Field of Classification Search
CPC ............. H01L 23/3114; H01L 23/3142; H01L 23/3185; H01L 2225/06582; H01L 29/861; H01L 41/053
See application file for complete search history.

(56) References Cited

U.S. PATENT DOCUMENTS

| | | | |
|---|---|---|---|
| 8,642,385 B2 | 2/2014 | Xue et al. | |
| 8,963,314 B2 | 2/2015 | Pieraerts et al. | |
| 2009/0267230 A1 | 10/2009 | Hwan | |
| 2011/0180897 A1* | 7/2011 | Pieraerts | H01L 23/3107 257/528 |
| 2013/0037935 A1* | 2/2013 | Xue | H01L 23/3114 257/737 |
| 2014/0070374 A1 | 3/2014 | Numaguchi | |
| 2017/0358510 A1 | 12/2017 | Park et al. | |
| 2018/0005912 A1 | 1/2018 | Oh et al. | |
| 2018/0033694 A1 | 2/2018 | Ueno et al. | |
| 2018/0102356 A1 | 4/2018 | Ghorbanzadeh et al. | |

* cited by examiner

*Primary Examiner* — Hoai V Pham
(74) *Attorney, Agent, or Firm* — Seed IP Law Group LLP

(57) ABSTRACT

The invention concerns a device comprising a support, an electrically-conductive layer covering the support, a semiconductor substrate on the conductive layer, and an insulating casing.

19 Claims, 3 Drawing Sheets

1A

1B

ELECTRONIC CHIP PACKAGE HAVING A SUPPORT AND A CONDUCTIVE LAYER ON THE SUPPORT

BACKGROUND

Technical Field

The present disclosure concerns electronic devices and, more particularly, an electronic device comprising an electronic chip housed in a package.

Discussion of the Related Art

An electronic chip is generally defined by a semiconductor substrate inside and at a top surface of which are located one or a plurality of interconnected components, such as transistors, forming circuits of the chip. In certain applications, such as electrostatic discharge protection, the chip comprises an avalanche diode.

Typically, a chip is housed in a package. The package comprises connection terminals, generally intended to be welded or soldered to a printed circuit such as a PCB ("Printed Circuit Board"). For a device comprising an electronic chip housed in a package to be compact, a CSP type package ("Chip Scale Package"), that is, occupying a small surface area, typically smaller than 1.2 times that of the chip substrate, is often used.

BRIEF SUMMARY

One or more embodiments are directed to a device comprising a support, an electrically-conductive layer covering the support, a semiconductor substrate or chip on the conductive layer, and an insulating casing.

According to an embodiment, the device comprises electronic components located inside and on top of the substrate.

According to an embodiment, the electrically conductive layer is metallic.

According to an embodiment, the substrate comprises a doped area defining an electrode of an avalanche diode.

According to an embodiment, the casing defines a CSP type package.

An embodiment provides a method of forming the above defined device.

According to an embodiment, the method comprises a step of simultaneous forming of a plurality of above-defined devices.

According to an embodiment, the substrates of the devices are portions of a same semiconductor wafer.

According to an embodiment, the method comprises a step of forming the electrically-conductive layer on a rear surface of the semiconductor wafer.

According to an embodiment, the method comprises a step of arranging a support plate on the rear surface side of the electrically-conductive layer.

According to an embodiment, the method comprises a step of forming trenches delimiting the substrates, the trenches preferably reaching a level located in the support plate.

BRIEF DESCRIPTION OF THE SEVERAL VIEWS OF THE DRAWINGS

The foregoing and other features and advantages will be discussed in detail in the following non-limiting description of specific embodiments in connection with the accompanying drawings.

DETAILED DESCRIPTION

Figure 1:
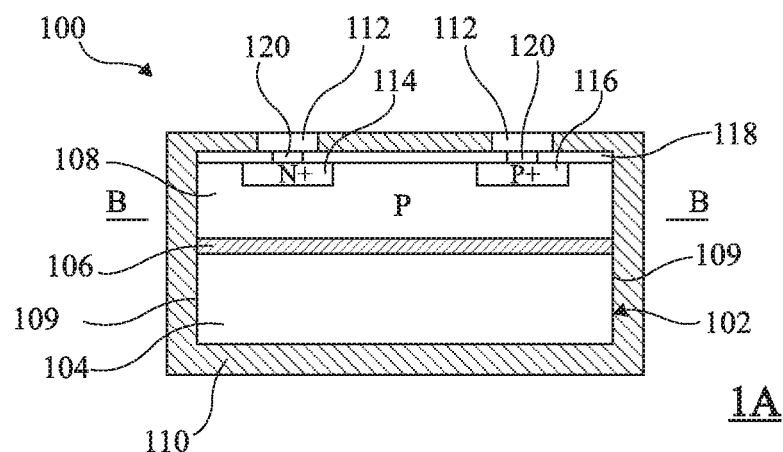
FIG. 1 schematically shows an embodiment of a device comprising an electronic chip in a package, in cross-section and top views 1A and 1B.
Figure 1:
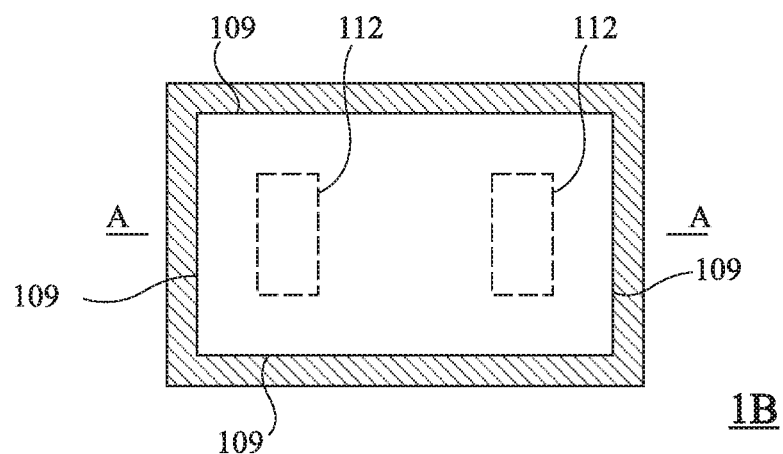

The same elements have been designated with the same reference numerals in the different drawings. In particular, the structural and/or functional elements common to the different embodiments may be designated with the same reference numerals and may have identical structural, dimensional, and material properties.

For clarity, only those steps and elements which are useful to the understanding of the described embodiments have been shown and are detailed. In particular, electronic chip circuits are not shown, the described embodiments being compatible with current chip circuits.

Throughout the present disclosure, the term "connected" is used to designate a direct electrical connection between circuit elements, whereas the term "coupled" is used to designate an electrical connection between circuit elements that may be direct, or may be via one or more intermediate elements such as resistors, capacitors, transistors or buffers. Unless indicated otherwise, when the term "coupled" is used, the connection can be implemented by a direct connection.

In the following description, when reference is made to terms qualifying absolute positions, such as "top", "bottom", "left", "right", etc., or relative positions, such as terms "above", "under", "upper", "lower", etc., or to terms qualifying directions, such as terms "horizontal", "vertical", etc., it is referred to the orientation of the drawings, except for FIG. 1B.

The terms "approximately", "substantially", and "in the order of" are used herein to designate a tolerance of plus or minus 10%, preferably of plus or minus 5%, of the value in question.

FIG. 1 schematically shows an embodiment of a device comprising an electronic chip in a package, in views 1A and 1B. Views 1A and 1B respectively are a side view and a top view along respective cross-section planes A-A and B-B.

Device 100 comprises a stack 102 of a support 104, of an electrically-conductive layer 106, and of a substrate 108. Layer 106 is located between support 104 and substrate 108.

Support 104 is preferably semiconductor, preferably made of silicon, but may be made of any of conductive or electrically-insulating material, preferably a material that can be thinned by common means, such as glass, sapphire, gallium nitride or silicon carbide. Layer 106 is preferably metallic, for example, made of copper or of aluminum. Layer 106 covers the rear surface of substrate 108, preferably integrally. Substrate 108 is an electronic chip or semiconductor chip having an active surface with one or a plurality of electronic circuit components integrated therein. Substrate 108 is made of semiconductor material, preferably made of silicon.

Preferably, support 104, metal layer 106, and substrate 108 are stacked so that their edges coincide. The edges of support 104, of metal layer 106, and of substrate 108 define sides 109 of the stack. Stack 102 preferably has the shape of a parallelepiped. The casing then covers the six surfaces of the parallelepiped.

Device 100 further comprises an insulating casing 110 which coats stack 102, that is, casing 110 covers the front and rear surfaces and sides 109 of stack 102, and is in adherent contact with sides 109. Preferably, casing 110 integrally covers the rear surface and sides 109. Preferably, casing 110 is crossed on the front surface side by connection terminals 112. Preferably, casing 110 integrally covers the front surface of stack 102 except for connection terminals 112. Casing 110 thus defines an electronic chip package. The package is preferably of CSP type.

The presence of support 104 enables to provide a thin substrate 108, for example, having a thickness of approximately 150 microns (μall) or smaller than 150 μm, preferably or approximately 100 μm or smaller than 100 μm, while being easy to manipulate with current means.

Due to the association of a thin substrate and of a conductive layer on the rear surface of the thin substrate, the operation of the device is improved over that of devices which do not have both a thin substrate and a metal layer on the rear surface, as described hereafter in the case of the shown example.

In the shown example, substrate 108 is for example P type doped. An N-type doped area 114 and a P-type doped area 116, separate from each other, are located on the front surface side of substrate 108. Area 114 and 116 preferably have doping levels (N+, P+) greater than that of substrate 108. Substrate 108 and area 114 may form together the PN junction of an avalanche diode.

Preferably, stack 102 comprises an insulating layer 118 covering substrate 108. In the shown example, layer 118 is crossed by electrically-conductive regions 120, for example, metallic, extending from regions 114 and 116 to terminals 112.

Figure 2:
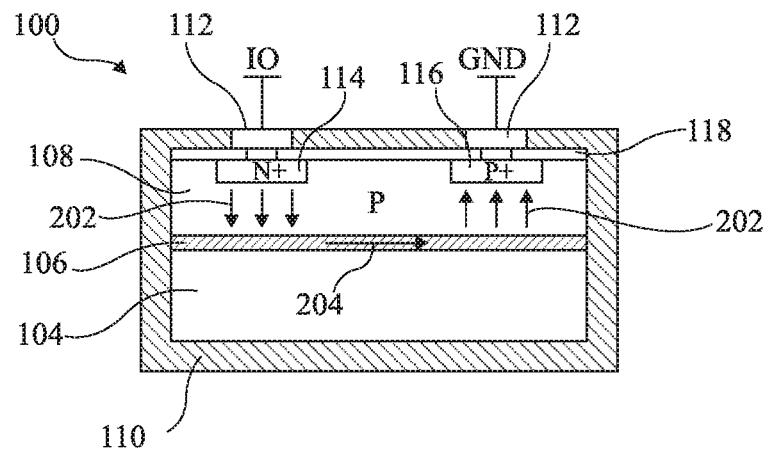
FIG. 2 is a cross-section view schematically illustrating an example of the device of FIG. 1 in operation.

FIG. 2 is a cross-section view illustrating the operation of the example of device 100 shown in FIG. 1.

Connection terminals 112 are for example coupled to a terminal of application of a reference potential, for example, a ground GND, and to a terminal IO to be protected against electrostatic discharges. In case of an electrostatic discharge causing an increase in the potential of terminal TO, the PN junction between doped area 114 and substrate 108 starts an avalanche. A current flows from area 114 to area 116, which drains off the discharge to ground.

Due to the fact that substrate 108 is thin and covers metal layer 106, the current flows vertically between each of areas 114 and 112 and metal layer 106 (arrow 202). The current is laterally conducted by metal layer 106 (arrow 204) from the location under area 114 to the location under area 112. A uniform distribution of the current coming out of area 114 is obtained. Such a distribution enables to drain off to ground a current having a higher intensity than when the substrate is not thin or has no metal layer under its rear surface. Indeed, with a non-thin substrate, or with no metal layer, the current would laterally flow between areas 114 and 116 through the substrate. The current would come out of area 114 and concentrate on the side of area 114 close to area 116. Such a concentration would limit the maximum intensity of the current.

The embodiment of FIGS. 1 and 2 is compatible with most electronic chip circuits. Layer 112 may comprise interconnection tracks between components of the circuits, such as transistors, located inside and on top of substrate 106. The circuits are connected to conductive regions 120 in contact with terminals 120.

Figure 3:
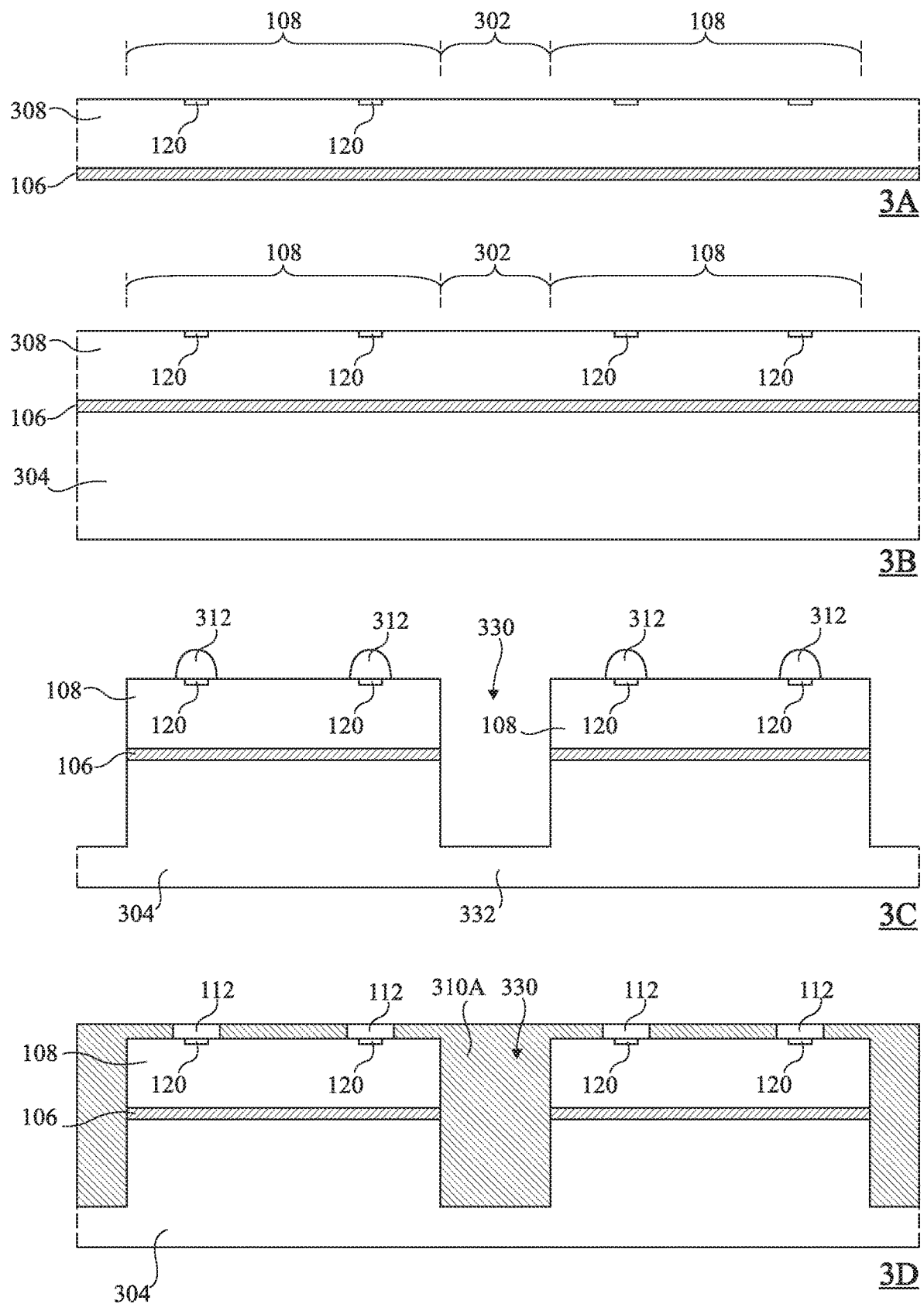
FIG. 3 shows steps 3A to 3D of a method of simultaneously forming a plurality of devices of FIG. 1.
Figure 4:
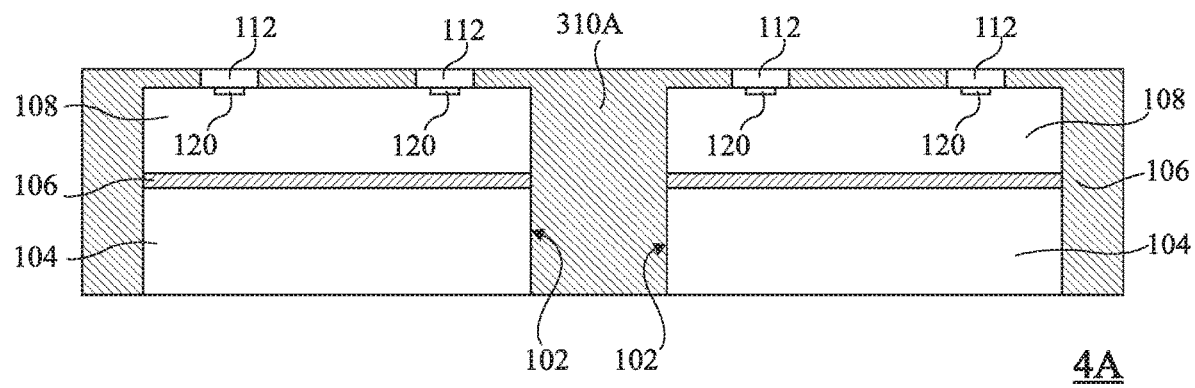
FIG. 4 shows steps 4A to 4C of a method of simultaneously forming a plurality of devices of FIG. 1.
Figure 4:
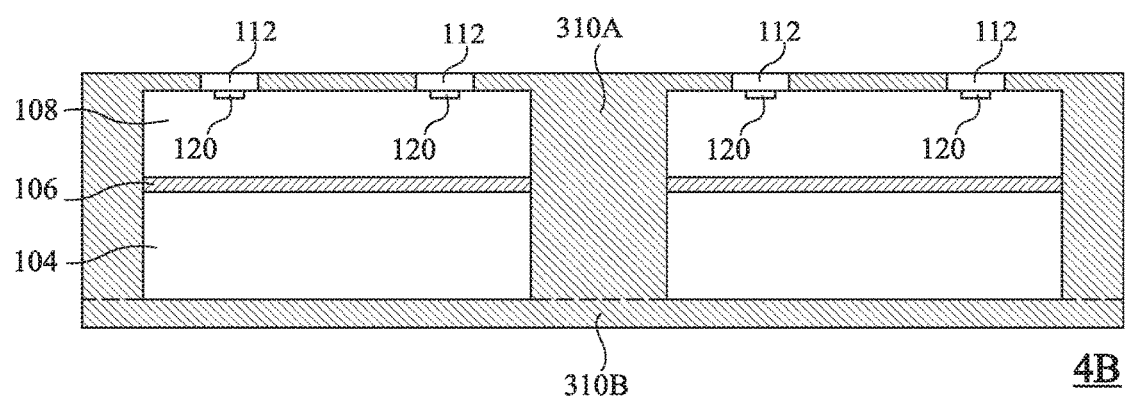
Figure 4:
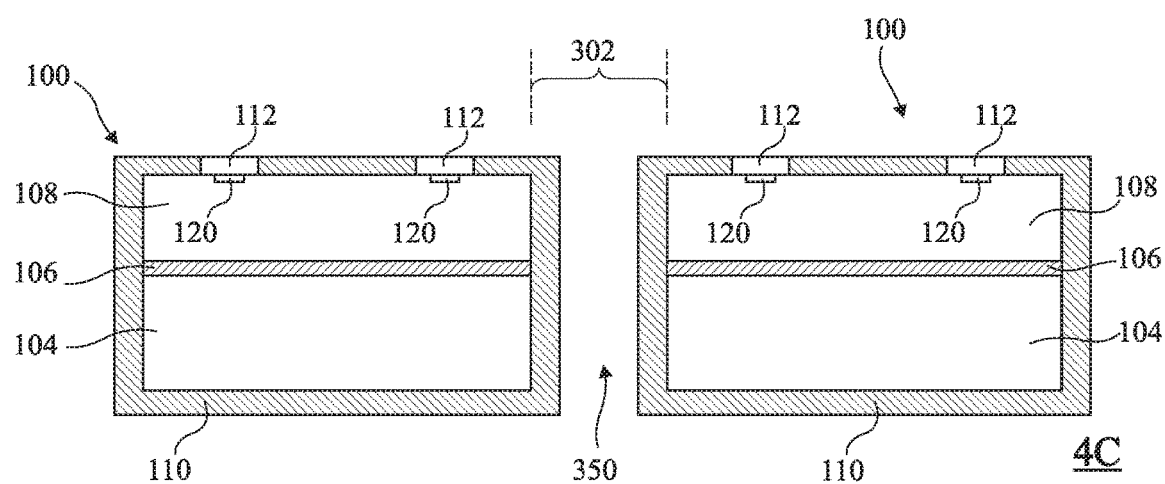

FIGS. 3 and 4 are partial simplified cross-section views illustrating steps 3A to 3D and 4A to 4C of implementation of a method of simultaneously forming a plurality of devices of the type of that in FIG. 1.

At the step of FIG. 3A, a semiconductor wafer 308 is provided. Wafer 308 is intended to be divided into individual substrates or chips. Each future substrate 108 corresponds to a portion of the wafer. The future substrates 108 are preferably separate, for example, separated by strips 302. As an example, the future substrates 108 are arranged in an array.

Electronic chip circuits are formed inside and on top of future substrates 108. The front surface of wafer 308 has conductive regions 120, connected to the circuits, formed thereon. Regions 120 are preferably accessible from the front surface. As an example, regions 120 are located in an insulating layer, not shown, covering the front surface. The insulating layer comprises possible interconnection tracks.

To give wafer 308 the thickness of the future substrates 108, wafer 308 is for example thinned, preferably after the forming of the circuits.

The rear surface of wafer 308 is then covered with a conductive layer 106, preferably metallic. Layer 106 preferably has a thickness in the range from 0.5 μm to 0.5 μm. Preferably, this thickness is chosen based on the electrical conductivity of the material of the layer 106.

At step 3B, a support plate 304 is arranged under the rear surface of layer 106. The future supports 104 are portions of plate 304. The thickness of plate 304 is preferably greater than that of the future supports 104. Plate 304 is for example glued to metal layer 106 by means of an adhesive. Preferably, the adhesive is distributed all across the surface of plate 304.

At step 3C, metal pads 312 covering conductive regions 120 are formed. Trenches 330 delimiting substrates 108 are then formed, such as by etching. Trenches 330 extend from the front surface of substrate 108 all the way to a level located in support plate 304. The depth of trenches 330 is preferably greater than the height of the future stacks 102. Portions 332 of plate 304 are left in place under the trenches.

At step 3D, the entire structure obtained at step 3C is covered with an insulator 310A filling trenches 330. All the elements located above a level running through metal pads 312 are then removed, for example, by surface treatment, such as polishing. This results in connection terminals 112 corresponding to the remaining portions of pads 312. Insulator 310A covers the upper surface of substrate 108 except for the locations of terminals 112. Terminals 112 are flush with the upper surface of insulator 310A.

At step 4A, the rear surface of the plate is surface treated, such as by polished, at least all the way until regions 332 have been totally removed from plate 304 which were located under trenches 330 before the polishing. Insulator 310A is then flush with the lower surface of the structure obtained after the polishing. Stacks 102, mechanically connected to one another by the adherence of the insulator to their sides, have thus been obtained.

At step 4B, a layer of an insulator 310B covering the rear surface of the structure obtained at step 4A is formed. Insulator 310B is preferably the same material as insulator 310A, for example, a resin.

At step 4C, the structure obtained at step 4B is cut into individual devices 100. For this purpose, insulator 310A is removed from regions 350 across the entire height of the structure, for example, by cutting. Regions 350 are located in strips 302 and have a width smaller than that of trenches 330, to leave portions of insulator 310A covering the sides of stacks 102. Each casing 110 comprises insulator portions 310A covering the front surface and the sides of the corresponding stack 102, and insulator portion 310B covering the rear surface of this stack.

Various embodiments and variations have been described. Such various embodiments and variations may be combined and other variations will occur to those skilled in the art. Finally, the practical implementation of the described embodiments and variations is within the abilities of those skilled in the art based on the functional indications given hereabove.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A device comprising:
a support;
an electrically conductive layer covering the support;
a semiconductor chip on the conductive layer, wherein the semiconductor chip has a thickness of about 150 microns or less; and
an insulating casing,
wherein the support, the semiconductor chip, and the electrically conductive layer have a same size and shape as each other in two dimensions.

2. The device of claim 1, wherein the semiconductor chip comprises an active surface integrating electronic components.

3. The device of claim 1, wherein the electrically conductive layer is metallic.

4. The device of claim 1, wherein the semiconductor chip comprises a doped area defining an electrode of an avalanche diode.

5. The device of claim 1, wherein the insulating casing defines a CSP-type package.

6. The device of claim 1, wherein the thickness of the semiconductor chip is less than 100 microns.

7. The device of claim 1, wherein the support, the semiconductor chip, and the electrically conductive layer form a stack that is parallelepiped shaped.

8. A semiconductor package comprising:
a support;
a semiconductor chip on the support;
an electrically conductive layer between the semiconductor chip and the support, the support, the semiconductor chip and electrically conductive layer having lateral surfaces that are coplanar with each other; and
an insulating material on the coplanar side surfaces.

9. The semiconductor package of claim 8, wherein the semiconductor chip has a thickness that is approximately 150 microns or less.

10. The semiconductor package of claim 8, wherein the semiconductor chip comprises a doped area defining an electrode of an avalanche diode.

11. The semiconductor package of claim 8, wherein the electrically conductive layer is a metal material.

12. The semiconductor package of claim 8, wherein the insulating material covers a bottom surface of the support.

13. The semiconductor package of claim 12, wherein the insulating material covers an active surface of the semiconductor chip except for a plurality of terminals of the semiconductor chip.

14. A device comprising:
a support of a semiconductor material;
an electrically conductive layer covering the support;
a semiconductor substrate on the electrically conductive layer, the semiconductor substrate having a first surface and a second surface opposite to one another, the first surface interfacing the electrically conductive layer, the second surface having one or more conductive features on the second surface, the electrically conductive layer being separated from any of the one or more conductive features on the second surface by the semiconductor substrate; and
an insulating casing covering the support and two side surfaces of the semiconductor substrate.

15. The device of claim 14, wherein the electrically conductive layer is metallic.

16. The device of claim 14, wherein the semiconductor substrate comprises a doped area defining an electrode of an avalanche diode.

17. The device of claim 14, wherein the insulating casing defines a CSP-type package.

18. The device of claim 14, wherein the thickness of the semiconductor substrate is less than 100 microns.

19. The device of claim 14, wherein the support, the semiconductor substrate, and the electrically conductive layer have a same size and shape as each other in two dimensions.

* * * * *